United States Patent
Chang

(10) Patent No.: US 10,388,873 B2
(45) Date of Patent: Aug. 20, 2019

(54) EVAPORATION MASK, METHOD OF PATTERNING SUBSTRATE USING THE SAME, AND DISPLAY SUBSTRATE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Shenchun Chang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhul (CN)

( * ) Notice: Subject to any disclaimer, the term of this patent is extended or adjusted under 35 U.S.C. 154(b) by 0 days.

(21) Appl. No.: 15/531,700

(22) PCT Filed: May 26, 2016

(86) PCT No.: PCT/CN2016/083442
§ 371 (c)(1),
(2) Date: May 30, 2017

(87) PCT Pub. No.: WO2017/156873
PCT Pub. Date: Sep. 21, 2017

(65) Prior Publication Data
US 2018/0080114 A1    Mar. 22, 2018

(30) Foreign Application Priority Data

Mar. 18, 2016    (CN) .................... 2016 2 0218013 U

(51) Int. Cl.
*H01L 51/00*    (2006.01)
*C23C 14/04*    (2006.01)
*H01L 51/56*    (2006.01)

(52) U.S. Cl.
CPC ........ *H01L 51/0011* (2013.01); *C23C 14/042* (2013.01); *H01L 51/56* (2013.01)

(58) Field of Classification Search
CPC .... C23C 14/042; H01L 51/0011; H01L 51/56
See application file for complete search history.

(56) References Cited

U.S. PATENT DOCUMENTS

2002/0076847 A1*  6/2002  Yamada ................ C23C 14/042
                                                  438/34
2011/0207328 A1*  8/2011  Speakman .......... H01L 51/0011
                                                  438/694

(Continued)

FOREIGN PATENT DOCUMENTS

CN    202786401 U    3/2013
CN    203960317 U    11/2014

(Continued)

OTHER PUBLICATIONS

International Search Report and Written Opinion in PCT/CN2016/083442 dated Dec. 8, 2016, with English translation.

*Primary Examiner* — Feifei Yeung Lopez
(74) *Attorney, Agent, or Firm* — Womble Bond Dickinson (US) LLP

(57) ABSTRACT

An evaporation mask is disclosed. The evaporation mask includes a mask frame, a set of first mask strips arranged on the mask frame along a first direction, and a set of second mask strips arranged on the set of first mask strips along a second direction different from the first direction. Each of the second mask strips has sections overlapping the first mask strips. The sections are embedded in respective ones of the first mask strips. Also disclosed is a method of patterning a substrate using the evaporation mask, as well as an organic light-emitting diode display substrate manufactured using the method.

11 Claims, 4 Drawing Sheets

(56) References Cited

U.S. PATENT DOCUMENTS

| | | | | |
|---|---|---|---|---|
| 2013/0134451 A1* | 5/2013 | Lee | ...................... | C23C 14/044 |
| | | | | 257/88 |
| 2015/0050767 A1* | 2/2015 | Kuriyama | ............. | C23C 14/042 |
| | | | | 438/34 |
| 2016/0343994 A1* | 11/2016 | Wu | ......................... | H01L 51/56 |

FOREIGN PATENT DOCUMENTS

| CN | 104536260 A | 4/2015 |
|---|---|---|
| CN | 105039907 A | 11/2015 |
| KR | 20140075033 A | 6/2014 |

* cited by examiner

EVAPORATION MASK, METHOD OF PATTERNING SUBSTRATE USING THE SAME, AND DISPLAY SUBSTRATE

CROSS-REFERENCE TO RELATED APPLICATIONS

The present application is the U.S. national phase entry of PCT/CN2016/08344, with an international filing date of May 26, 2016, which claims the benefit of Chinese Patent Application No. 201620218013.0, filed on Mar. 18, 2016, the entire disclosures of which are incorporated herein by reference.

TECHNICAL FIELD

The present disclosure relates to the field of display technologies, and particularly to an evaporation mask, a method of patterning a substrate using the evaporation mask, and an organic light-emitting diode display substrate manufactured using the method.

BACKGROUND

Due to their advantages such as a wide viewing angle, active luminescence, continuously adjustable colors, fast responsiveness, low energy consumption, a simple manufacture process, high light emission efficiency and an ability to display flexibly, organic light-emitting diode (OLED) displays are regarded as promising display products.

In manufacturing an OLED display, an evaporation mask is generally used as a mask for evaporation to form an evaporation pattern on a substrate. Traditional evaporation masks are manufactured by soldering mask strips on mask frames. Such a mask has mask strips intersecting each other, which are stacked on top of each other at the intersections. This leads to a large thickness of the mask, and thus is prone to a shadow effect in subsequent evaporation processes, i.e., the evaporated material is blocked by the mask between the evaporation source and the substrate and cannot be deposited on the substrate. The shadow effect may result in non-uniformity of the evaporated film and in turn affect the quality of the resultant OLED display.

SUMMARY

Embodiments of the present disclosure provide an evaporation mask which may reduce the thickness of the mask as a whole, and thus the shadow effect. Also provided is a method of patterning a substrate using the evaporation mask, as well as an organic light-emitting diode display substrate manufactured using the method.

According to an aspect of the present disclosure, an evaporation mask is provided comprising: a mask frame; a set of first mask strips arranged on the mask frame along a first direction; and a set of second mask strips arranged on the set of first mask strips along a second direction different from the first direction, each of the second mask strips having sections overlapping the first mask strips. The sections are embedded in respective ones of the first mask strips.

In some embodiments, the second direction is substantially perpendicular to the first direction.

In some embodiments, an upper surface of the first mask strips is flushed with an upper surface of the second mask strips.

In some embodiments, each of the first mask strips is provided with respective first grooves corresponding to respective ones of the sections of the second mask strips for accommodation of the respective sections.

In some embodiments, the first mask strips have a thickness of substantially 100 um, and the second mask strips have a thickness of substantially 50 um.

In some embodiments, each of the first mask strips is provided with respective second grooves corresponding to respective ones of the sections of the second mask strips, and each of the second mask strips is provided with respective third grooves snap-fitted with respective ones of the second grooves of the first mask strips.

In some embodiments, sections of each of the second mask strips located between every two adjacent ones of the first mask strips are provided, at a lower surface thereof, with second recesses extending along an edge of the lower surface.

In some embodiments, the first mask strips and the second mask strips have a thickness of substantially 100 um, and the second recesses have a depth of substantially 50 um.

In some embodiments, sections of each of the first mask strips located between every two adjacent ones of the second mask strips are provided, at a lower surface thereof, with first recesses extending along an edge of the lower surface.

In some embodiments, the first recesses have a depth of substantially 50 um.

According to another aspect of the present disclosure, a method of patterning a substrate using the evaporation mask as described in the first aspect is provided, which comprises: providing an evaporation material and the substrate; arranging the evaporation material on the substrate; and forming a pattern on the substrate by evaporating the evaporation material.

In some embodiments, the evaporation mask is arranged such that an upper surface of the evaporation mask faces the substrate.

According to yet another aspect of the present disclosure, an organic light-emitting diode display substrate manufactured using the method as described in the second aspect is provided.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed below in the description of exemplary embodiments with reference to the accompanying drawings, in which.

DETAILED DESCRIPTION

Figure 1:
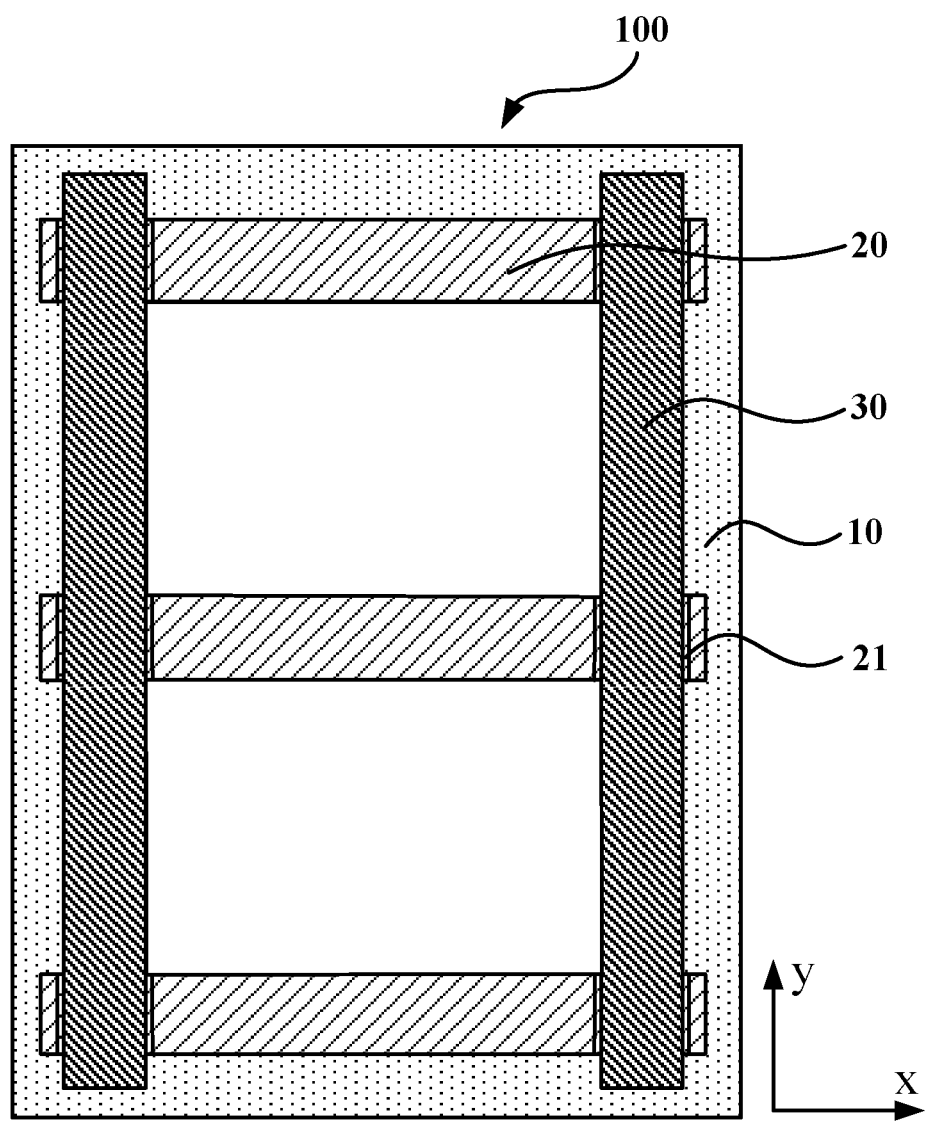
FIG. 1 is a schematic plan view of an evaporation mask according to an embodiment of the present disclosure.

The disclosure will now be described more fully hereinafter with reference to the accompanying drawings, in which exemplary embodiments of the disclosure are shown. The present disclosure may, however, be embodied in many different forms and should not be construed as being limited to the embodiments set forth herein.

Rather, these embodiments are provided so that this disclosure will be thorough and complete, and will fully convey the scope of the disclosure to those skilled in the art. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a schematic plan view of an evaporation mask 100 according to an embodiment of the present disclosure.

As shown in FIG. 1, the evaporation mask 100 comprises a mask frame 10, a set of first mask strips 20 arranged on the mask frame 10 along a first direction, and a set of second mask strips 30 arranged on the set of first mask strips 10 along a second direction.

The second direction is different from the first direction. In some embodiments, the second direction may be substantially perpendicular to the first direction. Specifically, in the example of FIG. 1, the first direction may be the x-axis direction, and the second direction may be the y-axis direction.

Each of the second mask strips 30 has sections overlapping the first mask strips 20 (referred to as "overlapped sections"). These overlapped sections are embedded in respective ones of the first mask strips 20. In some embodiments, each of the first mask strips 20 is provided with respective first grooves 21 corresponding to respective ones of the overlapped sections of the second mask strips 30. These first grooves 21 are provided for accommodation of the overlapped sections of the second mask strips 30, as will be described later in more detail.

This way, the thickness of the evaporation mask 100 as a whole is reduced and thus the shadow effect of the evaporation mask 100.

The evaporation mask 100 shown in FIG. 1 is exemplary. In other embodiments, the evaporation mask 100 may comprise other numbers of first mask strips 20 and second mask strips 30. For example, the evaporation mask 100 may comprise three or more second mask strips 30 and four or more first mask strips 20.

Referring to the coordinate system shown in FIG. 1, the surface of the evaporation mask 100 facing toward the positive direction of the z-axis (not shown in FIG. 1) is described hereinafter as an upper surface, with the other surface opposite to which being described as a lower surface. As stated above, the "upper surface" and the "lower surface" are spatially relative terms.

In some embodiments, the upper surface of the first mask strips 20 is flushed with the upper surface of the second mask strips 30. Namely, the upper surface of the first mask strips 20 and the upper surface of the second mask strips 30 are located in the same plane. In this way, a uniform spacing may be provided between individual regions of the evaporation mask 100 and the substrate to be patterned in the evaporation process, thus facilitating the uniformity of the evaporation.

Figure 2:
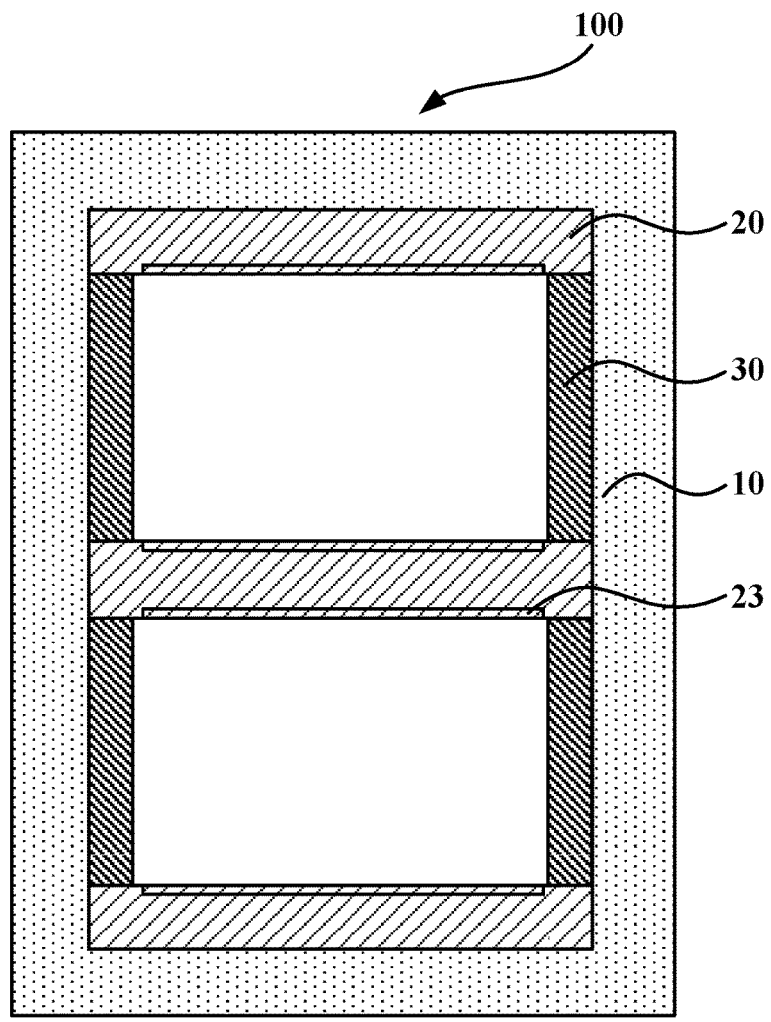
FIG. 2 is a schematic plan view of the other side of the evaporation mask of FIG. 1.

FIG. 2 is a schematic plan view of the other side (i.e., the lower surface) of the evaporation mask 100 of FIG. 1.

As shown in FIG. 2, the first mask strips 20 are spaced from each other, and the second mask strips 30 are spaced from each other. In this embodiment, sections of each of the first mask strips 20 located between every two adjacent ones of the second mask strips 30 are provided, at the lower surface thereof, with first recesses 23 extending along an edge of the lower surface.

It is known that the thickness of the edge region of the mask strip has a large influence on the shadow effect. Existence of the first recesses 23 may reduce the thickness of the edge regions of the first mask strips 20, thus further reducing the shadow effect of the mask.

Figure 3:
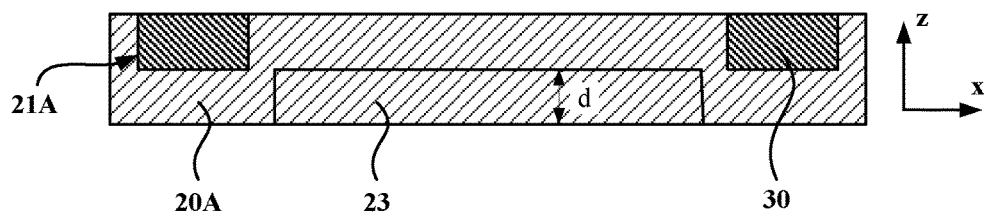
FIG. 3 is a schematic cross-sectional view of a combination of a first mask strip and second mask strips in an evaporation mask according to an embodiment of the present disclosure.

FIG. 3 is a schematic cross-sectional view of a combination of a first mask strip 20A and second mask strips 30 in an evaporation mask according to an embodiment of the present disclosure. This cross-sectional view is taken from the x-z plane.

As shown in FIG. 3, the first mask strip 20A is provided with first grooves 21A for accommodation of the second mask strips 30. In this embodiment, the first groove 21A has a rectangular cross section. More specifically, the first groove 21A is defined by two side walls opposite to each other and a bottom surface interfacing with the two side walls. Duet to the existence of the two side walls, the second mask strip 30 is restricted from moving in the x-axis direction. This provides the evaporation mask with improved structural stability.

Figure 4:
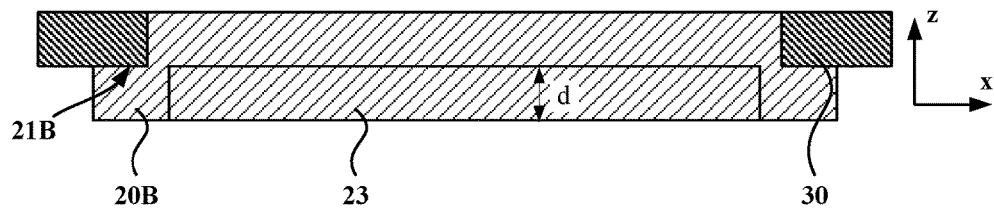
FIG. 4 is a schematic cross-sectional view of a combination of a first mask strip and second mask strips in an evaporation mask according to another embodiment of the present disclosure.

FIG. 4 is a schematic cross-sectional view of a combination of a first mask strip 20B and second mask strips 30 in an evaporation mask according to another embodiment of the present disclosure. This cross section is taken from the x-z plane. As shown in FIG. 4, the first groove 21B is an "open-ended" groove. More specifically, the first groove 21B is formed at an end of the first mask strip 20B, and is defined by a side wall and a bottom surface interfacing with the side wall. This is advantageous for assembly of the first mask strip 20B and the second mask strip 30 because the second mask strip 30 can now be embedded into the first mask strip 20B more easily.

In the examples of FIGS. 3 and 4, the first mask strips 20A, 20B may have a thickness of substantially 100 um, such as 100 um±1 um, and the second mask strips 30 may have a thickness of substantially 50 um, such as 50 um±1 um. In addition, the first recesses 23 may have a depth ("d") of substantially 50 um, such as 50 um±1 um. It has been observed with experiments that such a geometrical dimension is sufficient to provide the evaporation mask with a desired mechanical strength.

Two different combination structures of the second mask strips 30 and the first mask strips 20A, 20B have been shown in FIGS. 3 and 4 respectively. However, the present disclosure is not so limited.

Figure 5:
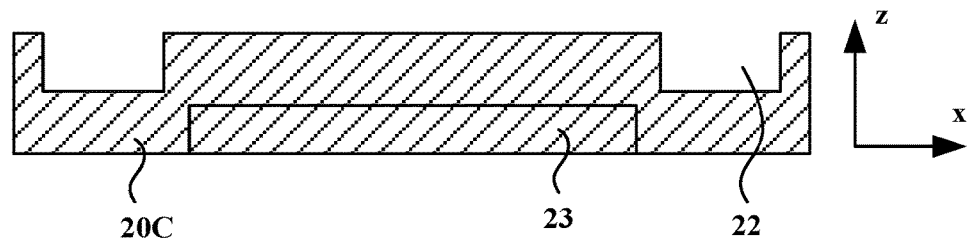
FIG. 5 is a schematic cross-sectional view of a first mask strip in an evaporation mask according to an embodiment of the present disclosure.

FIG. 5 is a schematic cross-sectional view of a first mask strip 20C in an evaporation mask according to an embodiment of the present disclosure. This cross section is taken from the x-z plane. In this embodiment, the first mask strip 20C is provided with second grooves 22. The structure of the first mask strip 20C is similar to that of the first mask strip 20A as described with respect to FIG. 3, and thus will not be described in detail.

Figure 6:
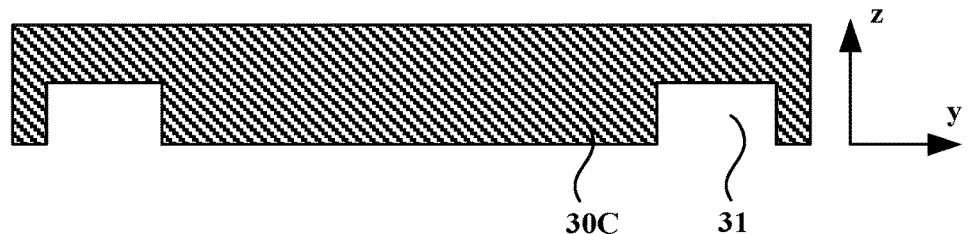
FIG. 6 is a schematic cross-sectional view of a second mask strip in an evaporation mask according to an embodiment of the present disclosure.

FIG. 6 is a schematic cross-sectional view of a second mask strip 30C in an evaporation mask according to an embodiment of the present disclosure. This cross section is taken from the y-z plane. The second mask strip 30C is provided with third grooves 31 which are arranged for snap-fitting with the second grooves 22 of the first mask strip 20C.

Figure 7A:
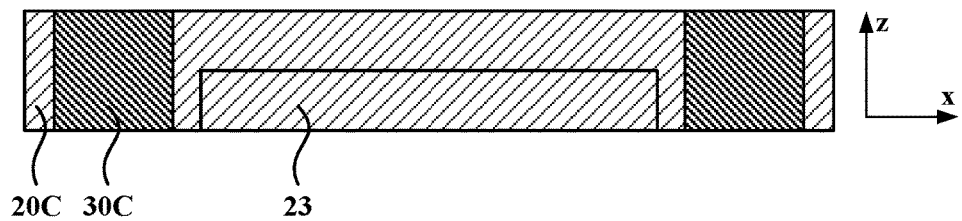
FIGS. 7A and 7B are schematic cross-sectional views of a combination of the first mask strip of FIG. 5 and the second mask strip of FIG. 6.
Figure 7B:
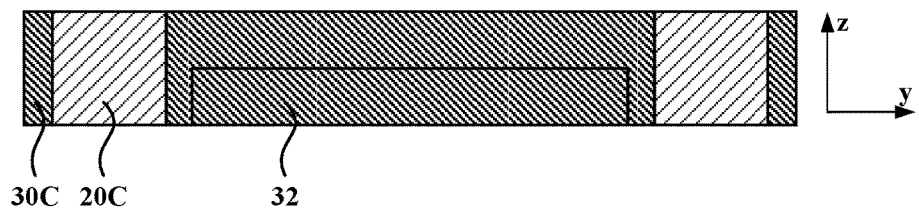

FIGS. 7A and 7B are schematic cross-sectional views of a combination of the first mask strip 20C of FIG. 5 and the second mask strip 30C of FIG. 6, wherein the cross section shown in FIG. 7A is taken from the x-z plane, and the cross section shown in FIG. 7B is taken from the y-z plane.

The snap-fitting of the third grooves 31 and the second grooves 22 may provide the evaporation mask with improved structural stability. Further, as shown in the figures, the first mask strip 20C and the second mask strip 30C have the same thickness. As compared with the second mask strip 30 shown in FIGS. 3 and 4, the second mask strip 30C has an increased thickness. This may provide the evaporation mask with increased mechanical strength.

In some embodiments, the first mask strip 20C and the second mask strip 30C have a thickness of substantially 100 um, such as 100 um±1 um.

In some embodiments, sections of the second mask strip 30C located between every two adjacent ones of the first mask strips 20C are further provided, at the lower surface thereof, with second recesses 32 extending along an edge of the lower surface. The existence of the second recesses 32 may reduce the thickness of the edge region of the second mask strip 30C, and thus the shadow effect of the mask. The second recesses 32 may have a thickness of substantially 50 um, such as 50 um±1 um.

The evaporation masks as described in the above embodiments may be used for patterning of a substrate. This may include the following steps: providing an evaporation material and the substrate, arranging the evaporation material on the substrate, and forming a pattern on the substrate by evaporating the evaporation material.

The evaporation mask may be arranged such that the upper surface of the evaporation mask faces the substrate. As described above, the upper surface of the first mask strips 20 is flushed with the upper surface of the second mask strips 30. In this way, a uniform spacing may be provided between individual regions of the evaporation mask and the substrate to be patterned in the evaporation process, thus facilitating the uniformity of the evaporation.

Figure 8:
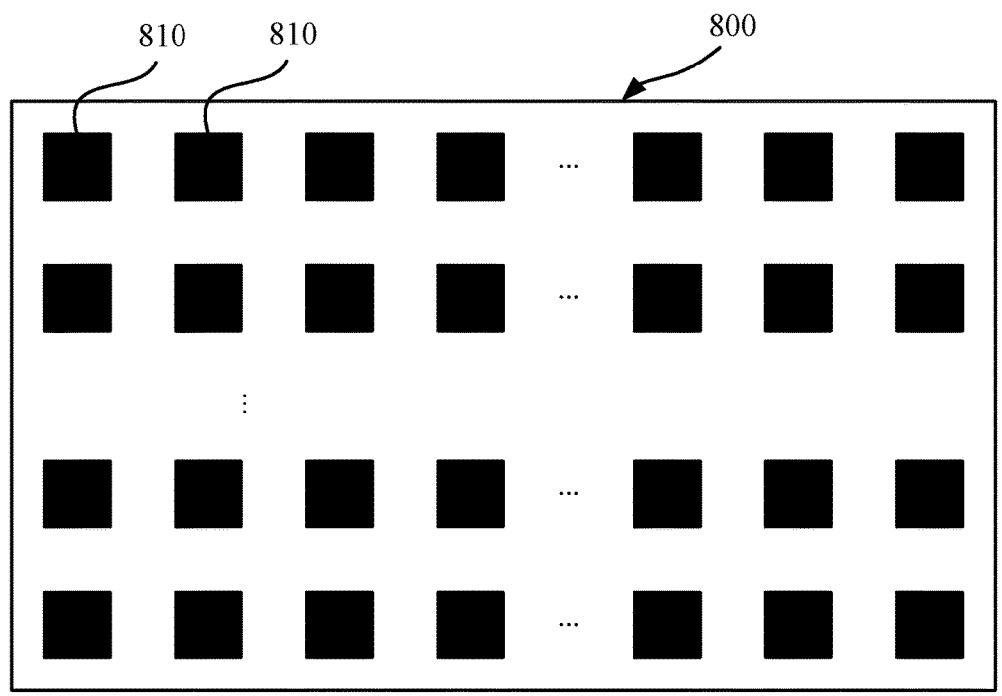
FIG. 8 is a schematic view of an organic light-emitting diode display substrate manufactured using an evaporated mask according to an embodiment of the present disclosure.

FIG. 8 shows a schematic view of an organic light-emitting diode display substrate 800 manufactured using such an evaporated mask.

In the evaporation process, evaporation of the material for manufacturing OLED devices within the pattern regions 810 is enabled by the evaporation mask such that desired thin film structures can be formed on the display substrate 800. The evaporation mask in accordance with embodiments of the present disclosure has a reduced shadow effect, and thus allows for uniform coverage of the evaporation material on the substrate.

Various modifications and variations to the present disclosure may be made by those skilled in the art without departing from the spirit and scope of the present disclosure. Thus, if these modifications and variations to the present disclosure fall within the scope of the appended claims of the present disclosure and equivalents thereof, such modifications and variations are intended to be encompassed in the present disclosure.

What is claimed is:

1. An evaporation mask comprising:
   a mask frame;
   a set of first mask strips arranged on the mask frame along a first direction; and
   a set of second mask strips arranged on the set of first mask strips along a second direction different from the first direction, each of the second mask strips having sections overlapping the first mask strips,
   wherein the sections are embedded in respective ones of the first mask strips,
   wherein each of the first mask strips is provided with respective grooves corresponding to respective ones of the sections of the second mask strips for accommodation of the respective sections,
   wherein first ones of the grooves, located at both ends of the first mask strip, are each an open-ended groove defined by only one side wall and one bottom surface interfacing with the side wall, and
   wherein sections of each of the first mask strips, located between every two adjacent ones of the second mask strips, are provided, at a lower surface thereof, with first recesses extending along an of the lower surface.

2. The evaporation mask of claim 1, wherein the second direction is perpendicular to the first direction.

3. The evaporation mask of claim 1, wherein an upper surface of the first mask strips is flushed with an upper surface of the second mask strips.

4. The evaporation mask of claim 1, wherein the first mask strips have a thickness of 100 um, and wherein the second mask strips have a thickness of 50 um.

5. The evaporation mask of claim 3, wherein second ones of the grooves other than the first grooves each accommodate a respective one of the sections of a respective one of the second mask strips, and wherein each of the respective second mask strips is provided with respective third grooves snap-fitted with respective ones of the second grooves of the first mask strips.

6. The evaporation mask of claim 5, wherein sections of each of the second mask strips, located between every two adjacent ones of the first mask strips, are provided, at a lower surface thereof, with recesses extending along an edge of the lower surface.

7. The evaporation mask of claim 6, wherein the first mask strips and the second mask strips have a thickness of 100 um, and wherein the recesses have a depth of 50 um.

8. The evaporation mask of claim 1, wherein the first recesses have a depth of 50 um.

9. A method of patterning a substrate using the evaporation mask of claim 1, comprising:
   providing an evaporation material and the substrate;
   arranging the evaporation material on the substrate; and
   forming a pattern on the substrate by evaporating the evaporation material.

10. The method of claim 9, wherein the arranging the evaporation material comprises having an upper surface of the evaporation mask face the substrate.

11. An organic light-emitting diode display substrate manufactured using the method of claim 9.

* * * * *